(12) United States Patent
Kameda et al.

(10) Patent No.: US 11,712,760 B2
(45) Date of Patent: Aug. 1, 2023

(54) LAYERED BONDING MATERIAL, SEMICONDUCTOR PACKAGE, AND POWER MODULE

(71) Applicant: SENJU METAL INDUSTRY CO., LTD., Tokyo (JP)

(72) Inventors: Naoto Kameda, Tokyo (JP); Masato Tsuchiya, Tokyo (JP); Katsuji Nakamura, Tokyo (JP); Osamu Munekata, Tokyo (JP); Kaichi Tsuruta, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/793,866

(22) PCT Filed: Mar. 19, 2021

(86) PCT No.: PCT/JP2021/011341
§ 371 (c)(1),
(2) Date: Jul. 19, 2022

(87) PCT Pub. No.: WO2021/193420
PCT Pub. Date: Sep. 30, 2021

(65) Prior Publication Data
US 2023/0039027 A1  Feb. 9, 2023

(30) Foreign Application Priority Data
Mar. 23, 2020  (JP) ................. 2020-050674

(51) Int. Cl.
*B23K 35/02* (2006.01)
*B23K 35/26* (2006.01)
(Continued)

(52) U.S. Cl.
CPC ........ *B23K 35/0238* (2013.01); *B23K 35/262* (2013.01); *B32B 15/01* (2013.01);
(Continued)

(58) Field of Classification Search
CPC .............. B23K 35/0238; B23K 35/262; B23K 2101/40; B32B 15/01; B32B 2307/732;
(Continued)

(56) References Cited

U.S. PATENT DOCUMENTS

| 4,211,827 A | 7/1980 | Pryor et al. |
| 7,830,001 B2 * | 11/2010 | Yokota ................ H01L 23/3735 257/E23.009 |

(Continued)

FOREIGN PATENT DOCUMENTS

| CN | 1754010 | 3/2006 |
| CN | 103827353 | 5/2014 |

(Continued)

OTHER PUBLICATIONS

International Search Report issued Apr. 27, 2021 in International (PCT) Application No. PCT/JP2021/011341.
(Continued)

*Primary Examiner* — Jasmine J Clark
(74) *Attorney, Agent, or Firm* — Wenderoth, Lind & Ponack, L.L.P.

(57) ABSTRACT

In a layered bonding material 10, a coefficient of linear expansion of a base material 11 is 5.5 to 15.5 ppm/K and a first surface and a second surface of the base material 11 are coated with pieces of lead-free solder 12a and 12b.

29 Claims, 4 Drawing Sheets

(51) Int. Cl.
  *B32B 15/01* (2006.01)
  *H01L 23/367* (2006.01)
  *H01L 23/00* (2006.01)
  *B23K 101/40* (2006.01)

(52) U.S. Cl.
  CPC .......... *H01L 23/3672* (2013.01); *H01L 24/29* (2013.01); *H01L 24/32* (2013.01); *B23K 2101/40* (2018.08); *B32B 2307/732* (2013.01); *H01L 2224/2908* (2013.01); *H01L 2224/2918* (2013.01); *H01L 2224/29111* (2013.01); *H01L 2224/29147* (2013.01); *H01L 2224/29155* (2013.01); *H01L 2224/29184* (2013.01); *H01L 2224/32225* (2013.01)

(58) Field of Classification Search
  CPC ..... H01L 23/3672; H01L 24/29; H01L 24/32; H01L 23/3735; H01L 23/29; H01L 23/3652
  See application file for complete search history.

(56) References Cited

U.S. PATENT DOCUMENTS

| | | |
|---|---|---|
| 2007/0071994 A1 | 3/2007 | Hayashida et al. |
| 2011/0198755 A1 | 8/2011 | Maeda et al. |
| 2013/0134591 A1 | 5/2013 | Sakamoto et al. |
| 2014/0234649 A1 | 8/2014 | Kalich et al. |
| 2016/0027714 A1 | 1/2016 | Orimoto et al. |
| 2018/0244561 A1 | 8/2018 | Aoyagi et al. |
| 2021/0202350 A1 | 7/2021 | Eisele |
| 2021/0267052 A1 | 8/2021 | Shiraokawa et al. |

FOREIGN PATENT DOCUMENTS

| | | |
|---|---|---|
| CN | 107922248 | 4/2018 |
| JP | 3-218031 | 9/1991 |
| JP | 2009-147111 | 7/2009 |
| JP | 2009-269075 | 11/2009 |
| JP | 2012-35291 | 2/2012 |
| JP | 2015-23183 | 2/2015 |
| JP | 2019-508250 | 3/2019 |
| KR | 10-2011-0059653 | 6/2011 |
| TW | 202005800 | 2/2020 |
| WO | 2009/098865 | 8/2009 |
| WO | 2014/141399 | 9/2014 |

OTHER PUBLICATIONS

Decision to Grant a Patent dated Mar. 16, 2021 in Japanese Application No. 2020-050674, with English translation.
Notice of Reasons for Refusal dated Jan. 5, 2021 in Japanese Application No. 2020-050674, with English translation.
Office Action dated Feb. 11, 2023, in corresponding Chinese Patent Application No. 202180021864.X, with English translation.
Keke Zhang et al., Special Advanced Welding and Joining Technology, vol. 3, pp. 296-297, Aug. 31, 2016, with English translation.

* cited by examiner

FIG. 3

| | BASE MATERIAL | COEFFICIENT OF LINEAR EXPANSION [ppm/K] | THERMAL CONDUCTIVITY [W/(m·K)] | THICKNESS OF BASE MATERIAL [μm] | SOLDER | THICKNESS OF SOLDER [μm] | DEFECT PART CHANGE RATIO |
|---|---|---|---|---|---|---|---|
| EXAMPLE 1 | 15Cu-85W | 7.0 | 184 | 200 | SAC305 (Sn-3.0Ag-0.5Cu) | 50 | ◎ |
| EXAMPLE 2 | 30Cu-70Mo | 7.7 | 195 | 200 | SAC305 | 50 | ◎ |
| EXAMPLE 3 | 15Cu-85W | 7.0 | 184 | 200 | SAC305 | 20 | ◎ |
| EXAMPLE 4 | 30Cu-70Mo | 7.7 | 195 | 200 | SAC305 | 20 | ◎ |
| EXAMPLE 5 | 15Cu-85W | 7.0 | 184 | 200 | SAC305 | 100 | ◎ |
| EXAMPLE 6 | 30Cu-70Mo | 7.7 | 195 | 200 | SAC305 | 100 | ◎ |
| EXAMPLE 7 | 6Cu-94W | 5.9 | 141 | 200 | SAC305 | 50 | ○ |
| EXAMPLE 8 | 10Cu-90W | 6.5 | 174 | 200 | SAC305 | 50 | ○ |
| EXAMPLE 9 | 20Cu-80W | 7.9 | 200 | 200 | SAC305 | 50 | ◎ |
| EXAMPLE 10 | 30Cu-70W | 9.4 | 251 | 200 | SAC305 | 50 | ◎ |
| EXAMPLE 11 | 15Cu-85Mo | 6.8 | 148 | 200 | SAC305 | 50 | ○ |
| EXAMPLE 12 | 35Cu-65Mo | 8.2 | 210 | 200 | SAC305 | 50 | ◎ |
| EXAMPLE 13 | 40Cu-60Mo | 8.8 | 220 | 200 | SAC305 | 50 | ◎ |
| EXAMPLE 14 | 50Cu-50Mo | 9.9 | 252 | 200 | SAC305 | 50 | ◎ |
| EXAMPLE 15 | 60Cu-40Mo | 11.5 | 275 | 200 | SAC305 | 50 | ◎ |

FIG. 4

| | BASE MATERIAL | COEFFICIENT OF LINEAR EXPANSION [ppm/K] | THERMAL CONDUCTIVITY [W/(m·K)] | THICKNESS OF BASE MATERIAL [μm] | SOLDER | THICKNESS OF SOLDER [μm] | DEFECT PART CHANGE RATIO |
|---|---|---|---|---|---|---|---|
| EXAMPLE 16 | Cu/30Cu-70Mo/Cu (RATIO OF THICKNESSES 1:4:1) | 7.7 | 200 | 200 | SAC305 | 50 | ◎ |
| EXAMPLE 17 | Cu/30Cu-70Mo/Cu (RATIO OF THICKNESSES 2:3:2) | 10.6 | 235 | 200 | SAC305 | 50 | ◎ |
| EXAMPLE 18 | Cu/30Cu-70Mo/Cu (RATIO OF THICKNESSES 1:1:1) | 11.6 | 260 | 200 | SAC305 | 50 | ◎ |
| EXAMPLE 19 | Cu/30Cu-70Mo/Cu (RATIO OF THICKNESSES 2:1:2) | 14.4 | 300 | 200 | SAC305 | 50 | ○ |
| EXAMPLE 20 | Cu/50Cu-50Mo/Cu (RATIO OF THICKNESSES 1:1:1) | 13.8 | 300 | 200 | SAC305 | 50 | ○ |
| COMPARATIVE EXAMPLE 1 | NONE | - | - | - | SAC305 | 300 | × |
| COMPARATIVE EXAMPLE 2 | 100Cu | 17.1 | 394 | 200 | SAC305 | 50 | × |
| COMPARATIVE EXAMPLE 3 | 100Cu | 17.1 | 394 | 200 | SAC305 | 20 | × |
| COMPARATIVE EXAMPLE 4 | NONE | - | - | - | SAC305 | 400 | × |
| COMPARATIVE EXAMPLE 5 | 100Cu | 17.1 | 394 | 200 | SAC305 | 100 | × |
| COMPARATIVE EXAMPLE 6 | W | 4.6 | 142 | 200 | SAC305 | 50 | × |
| COMPARATIVE EXAMPLE 7 | Mo | 5.2 | 167 | 200 | SAC305 | 50 | × |

FIG. 5

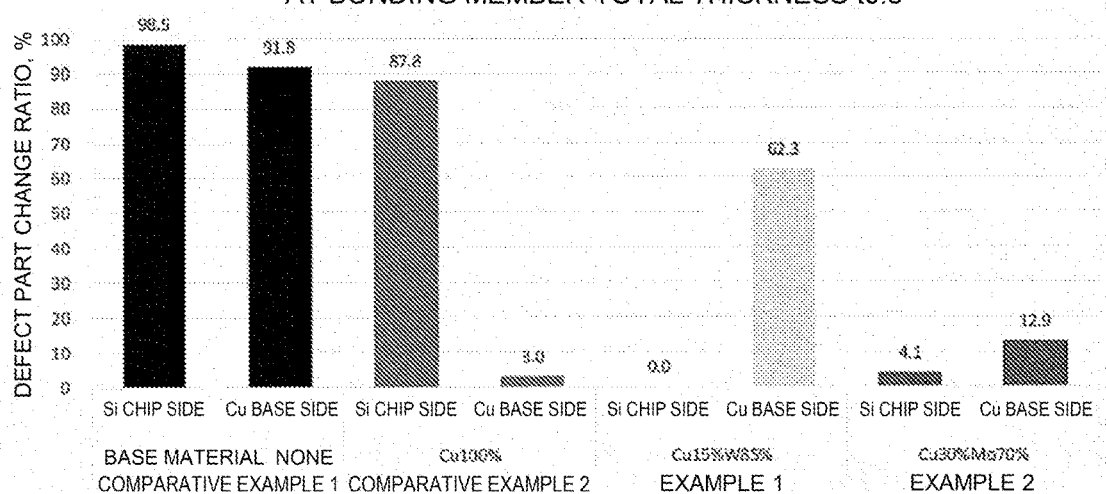

DEFECT PART CHANGE RATIO FROM initial TO AFTER 1000 cyc. AT BONDING MEMBER TOTAL THICKNESS t0.3

LAYERED BONDING MATERIAL, SEMICONDUCTOR PACKAGE, AND POWER MODULE

TECHNICAL FIELD

The present disclosure relates to a layered bonding material, a semiconductor package, and a power module.

BACKGROUND ART

Recently, required characteristics of semiconductor devices have become higher. SiC, GaAs, GaN, and the like are used in addition to Si, which has been used as a material of semiconductor devices. Semiconductor devices made of these materials have excellent characteristics including a rise in an operating temperature and expanded bandgaps. The semiconductor devices are applied to power semiconductor devices such as a power transistor.

The power semiconductor devices are capable of performing a high-temperature operation. The temperature of a solder joint in a bonding section sometimes reaches high temperature equal to or higher than 200° C. Under such a high-temperature environment, there is a problem in that a distortion due to a difference between CTEs (Coefficients of Thermal Expansion) of a semiconductor device and a substrate occurs in a bonding section between the semiconductor device and the substrate, a crack occurs from the distortion, and, as a result, the life of the power semiconductor product is reduced.

Japanese Patent Laid-Open No. 2009-269075 describes a manufacturing method for a layered solder material including soft Pb or Pb-based alloy as a stress relaxation layer. However, since the stress relaxation layer contains Pb, the manufacturing method does not conform to environmental regulations such as a RoHS (Restriction of Hazardous Substances).

Japanese Patent Laid-Open No. 2015-23183 describes a power module including a semiconductor device, a first metal layer formed with one surface bonded to the semiconductor device, an organic insulating film that is in contact with the semiconductor device and formed in an outer circumference peripheral section of the other surface of the first metal layer, a second metal layer that is in contact with the organic insulating film and is formed to be bonded to the center of the other surface of the first metal layer, and a bonding material formed to be bonded to the other surface of the first metal layer via the second metal layer.

Japanese Patent Laid-Open No. 2009-147111 describes a bonding material obtained by stacking surface layers on upper and lower surfaces of a plate-like center layer, the center layer having a melting point higher than a melting point of the surface layers. As specific examples of the center layer, a single phase of bismuth or an alloy with silver, copper, antimony, indium, tin, nickel, germanium, tellurium, or phosphorus containing bismuth as a main component is described.

SUMMARY OF INVENTION

It is desired to provide a layered bonding material, a semiconductor package, and a power module that can relax a distortion that occurs in a bonding section, in particular, under a high-temperature environment.

In a layered bonding material according to an embodiment, a coefficient of linear expansion of a base material is 5.5 to 15.5 ppm/K and a first surface and a second surface of the base material are coated with lead-free solder.

BRIEF DESCRIPTION OF DRAWINGS

FIG. 3 is a table showing the configuration of a bonding member used in a cooling and heating cycle test.

FIG. 4 is a table showing the configuration of the bonding member used in the cooling and heating cycle test.

FIG. 5 is a bar graph showing defect part change ratios of examples 1 and 2 and comparative examples 1 and 2 in comparison.

DESCRIPTION OF EMBODIMENT

Figure 1:
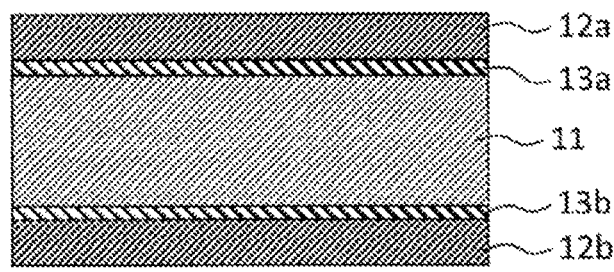
FIG. 1 is a longitudinal sectional view showing a schematic configuration of a layered bonding material according to an embodiment.

As a result of, while conforming to environmental regulations such as the RoHS, repeating intensive studies in order to find a technique that can relax a distortion that occurs in a bonding section, the present inventors came to know that a distortion that occurs in the bonding section due to a CTE difference between a semiconductor device and a substrate can be relaxed by using a material having a coefficient of thermal expansion within a predetermined range as a core material while adopting lead-free solder as solder of the bonding section. Further, the present inventors came to know that an excessive temperature rise of the bonding section can be suppressed and, as a result, the life of a product can be greatly extended compared with the related art by using, in particular, a Cu—W-based material or a Cu—Mo-based material (or a layered material or a composite material thereof) as the core material while adopting the lead-free solder as the solder of the bonding section. An embodiment explained below has been devised based on such knowledge.

In a layered bonding material according to a first aspect of the embodiment, a coefficient of linear expansion of a base material is 5.5 to 15.5 ppm/K, and a first surface and a second surface of the base material are coated with lead-free solder.

When the present inventors actually performed verification with a cooling and heating cycle test, it was found that, according to such an aspect, it is possible to relax a distortion that occurs in a bonding section, in particular, under a high-temperature environment and achieve high reliability. According to the idea of the present inventors, the coefficient of linear expansion of the base material is present in the middle between a coefficient of linear expansion of a semiconductor device and a coefficient of linear expansion of a material of a substrate and a heat radiating section and is balanced. Therefore, it is considered possible to relax a distortion that occurs in the bonding section due to a CTE difference between the semiconductor device and the substrate, in particular, under a high-temperature environment.

A layered bonding material according to a second aspect of the embodiment is the layered bonding material according to the first aspect, wherein the coefficient of linear expansion of the base material is 5.9 to 14.4 ppm/K.

When the present inventors actually performed verification with the cooling and heating cycle test, it was found that, according to such an aspect, it is possible to relax a distortion that occurs in a bonding section on the semiconductor device side, in particular, under a high-temperature environment and achieve high reliability.

A layered bonding material according to a third aspect of the embodiment is the layered bonding material according to the first or second aspect, wherein the coefficient of linear expansion of the base material is 7.0 to 11.6 ppm/K.

When the present inventors actually performed verification with the cooling and heating cycle test, it was found that, according to such an aspect, an effect of relaxing a distortion that occurs in a bonding section on the substrate side is higher and it is possible to achieve higher reliability.

A layered bonding material according to a fourth aspect of the embodiment is the layered bonding material according to any one of the first to third aspects, wherein the base material is made of any one of a Cu—W-based material, a Cu—Mo-based material, a layered material of the Cu—W-based material and the Cu—Mo-based material, a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material.

According to such an aspect, since the base material has high thermal conductivity, it is possible to prevent an excessive temperature rise in the bonding section, a thermal distortion itself that occurs in the bonding section is reduced, and, as a result, this more advantageously acts on the extension of the life of a product.

A layered bonding material according to a fifth aspect of the embodiment is the layered bonding material according to any one of the first to fourth aspects, wherein a Cu content of the base material is 60% or lower.

According to such an aspect, since the coefficient of linear expansion of the base material is lower, it is possible to further relax a distortion that occurs in the bonding section due to the CTE difference, in particular, under a high-temperature environment.

A layered bonding material according to a sixth aspect of the embodiment is the layered bonding material according to any one of the first to fifth aspects, wherein a Cu content of the base material is 15% or higher.

According to such an aspect, since the thermal conductivity of the base material is further improved, a thermal distortion itself that occurs in the bonding section can be further reduced.

A layered bonding material according to a seventh aspect of the embodiment is the layered bonding material according to any one of the first to sixth aspects, wherein an interface between at least one of the first surface and the second surface of the base material and the lead-free solder is undercoated with Ni and Sn in order from the base material side.

According to such an aspect, it is possible to improve adhesion of the base material and the lead-free solder.

A layered bonding material according to an eighth aspect of the embodiment is the layered bonding material according to any one of the first to seventh aspects, wherein at least one of a thickness of the lead-free solder with which the first surface is coated and a thickness of the lead-free solder with which the second surface is coated is 20 to 100 μm.

A layered bonding material according to a ninth aspect of the embodiment is the layered bonding material according to any one of the first to eighth aspects, wherein at least one of a ratio of thicknesses of the base material and the lead-free solder with which the first surface is coated and a ratio of thicknesses of the base material and the lead-free solder with which the second surface is coated is 2:1 to 10:1.

A layered bonding material according to a tenth aspect of the embodiment is the layered bonding material according to any one of the first to ninth aspects, wherein a melting point of the lead-free solder is 210° C. or higher. The melting point of the lead-free solder may be 230° C. or higher.

According to such an aspect, even when the temperature of the layered bonding material reaches high temperature equal to or higher than 200° C. because of a rise in an operating temperature of the semiconductor device, the lead-free solder included in the layered bonding material can be prevented from melting to cause a breakdown.

A semiconductor package according to an eleventh aspect of the embodiment includes: a substrate; a semiconductor device disposed on the substrate; and a layered bonding material disposed between the substrate and the semiconductor device and bonding the substrate and the semiconductor device, wherein, in the layered bonding material, a coefficient of linear expansion of a base material is 5.5 to 15.5 ppm/K, and a first surface and a second surface of the base material are coated with lead-free solder.

When the present inventors actually performed verification with a cooling and heating cycle test, it was found that, according to such an aspect, it is possible to relax a distortion that occurs in a bonding section, in particular, under a high-temperature environment and achieve high reliability. According to the idea of the present inventors, the coefficient of linear expansion of the base material included in the layered bonding material is present in the middle between a coefficient of linear expansion of a material of the semiconductor device and a coefficient of linear expansion of the substrate and is balanced. Therefore, it is considered possible to relax a distortion that occurs in the bonding section due to a CTE difference between the semiconductor device and the substrate, in particular, under a high-temperature environment.

A semiconductor package according to a twelfth aspect of the embodiment includes: a substrate; a semiconductor device disposed on the substrate; a first layered bonding material disposed between the substrate and the semiconductor device and bonding the substrate and the semiconductor device; a heat radiating section disposed on an opposite side of the semiconductor device on the substrate; and a second layered bonding material disposed between the substrate and the heat radiating section and bonding the substrate and the heat radiating section, wherein, in at least one of the first layered bonding material and the second layered bonding material, a coefficient of linear expansion of a base material is 5.5 to 15.5 ppm/K, and a first surface and a second surface of the base material are coated with lead-free solder.

When the present inventors actually performed verification with a cooling and heating cycle test, it was found that, according to such an aspect, it is possible to relax a distortion that occurs in a bonding section, in particular, under a high-temperature environment and achieve high reliability. According to the idea of the present inventors, the coefficient of linear expansion of the base material included in the layered bonding material is present in the middle between a coefficient of linear expansion of the semiconductor device and a coefficient of linear expansion of a material of the substrate and the heat radiating section and is balanced. Therefore, it is considered possible to relax a distortion that occurs in the bonding section due to a CTE difference between the semiconductor device and the substrate, in particular, under a high-temperature environment.

A semiconductor package according to a thirteenth aspect of the embodiment is the semiconductor package according to the eleventh or twelfth aspect, wherein the coefficient of linear expansion of the base material is 5.9 to 14.4 ppm/K.

When the present inventors actually performed verification with a cooling and heating cycle test, it was found that, according to such an aspect, it is possible to relax a distortion that occurs in the bonding section on the semiconductor device side, in particular, under a high-temperature environment and achieve high reliability.

A semiconductor package according to a fourteenth aspect of the embodiment is the semiconductor package according to any one of the eleventh to thirteenth aspects, wherein the coefficient of linear expansion of the base material is 7.0 to 11.6 ppm/K.

When the present inventors actually performed verification with the cooling and heating cycle test, it was found that, according to such an aspect, an effect of relaxing a distortion that occurs in a bonding section on the substrate side is higher and it is possible to achieve higher reliability.

A semiconductor package according to a fifteenth aspect of the embodiment is the semiconductor package according to any one of the eleventh to fourteenth aspects, wherein the base material is made of any one of a Cu—W-based material, a Cu—Mo-based material, a layered material of the Cu—W-based material and the Cu—Mo-based material, a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material.

According to such an aspect, since the base material has high thermal conductivity, it is possible to prevent an excessive temperature rise in the bonding section, a thermal distortion itself that occurs in the bonding section is reduced, and, as a result, this more advantageously acts on the extension of the life of a product.

A semiconductor package according to a sixteenth aspect of the embodiment is the semiconductor package according to any one of the eleventh to fifteenth aspects, wherein a Cu content of the base material is 60% or lower.

According to such an aspect, since the coefficient of linear expansion of the base material included in the layered bonding material is lower, it is possible to further relax a distortion that occurs in the bonding section due to the CTE difference, in particular, under a high-temperature environment.

A semiconductor package according to a seventeenth aspect of the embodiment is the semiconductor package according to any one of the eleventh to sixteenth aspects, wherein a Cu content of the base material is 15% or higher.

According to such an aspect, since the thermal conductivity of the base material included in the layered bonding material is further improved, a thermal distortion itself that occurs in the bonding section can be further reduced.

A semiconductor package according to an eighteenth aspect of the embodiment is the semiconductor package according to any one of the eleventh to seventeenth aspects, wherein an interface between at least one of the first surface and the second surface of the base material and the lead-free solder is undercoated with Ni and Sn in order from the base material side.

According to such an aspect, it is possible to improve adhesion of the base material included in the layered bonding material and the lead-free solder.

A semiconductor package according to a nineteenth aspect of the embodiment is the semiconductor package according to any one of the eleventh to eighteenth aspects, wherein at least one of a thickness of the lead-free solder with which the first surface is coated and a thickness of the lead-free solder with which the second surface is coated is 20 to 100 μm.

A semiconductor package according to a twentieth aspect of the embodiment is the semiconductor package according to any one of the eleventh to nineteenth aspects, wherein at least one of a ratio of thicknesses of the base material and the lead-free solder with which the first surface is coated and a ratio of thicknesses of the base material and the lead-free solder with which the second surface is coated is 2:1 to 10:1.

A semiconductor package according to a twenty-first aspect of the embodiment is the semiconductor package according to any one of the eleventh to twentieth aspects, wherein a melting point of the lead-free solder is 210° C. or higher. The melting point of the lead-free solder may be 230° C. or higher.

According to such an aspect, even when the temperature of the layered bonding material reaches high temperature equal to or higher than 200° C. because of a rise in an operating temperature of the semiconductor device, the lead-free solder included in the layered bonding material can be prevented from melting to cause a breakdown.

A power module according to a twenty-second aspect of the embodiment includes: a substrate; a power semiconductor device disposed on the substrate; and a layered bonding material disposed between the substrate and the power semiconductor device and bonding the substrate and the power semiconductor device, wherein, in the layered bonding material, a coefficient of linear expansion of a base material is 5.5 to 15.5 ppm/K or less, and a first surface and a second surface of the base material are coated with lead-free solder.

When the present inventors actually performed verification with a cooling and heating cycle test, it was found that, according to such an aspect, it is possible to relax a distortion that occurs in a bonding section, in particular, under a high-temperature environment and achieve high reliability. According to the idea of the present inventors, the coefficient of linear expansion of the base material included in the layered bonding material is present in the middle between a coefficient of linear expansion of the semiconductor device and a coefficient of linear expansion of the substrate and is balanced. Therefore, it is considered possible to relax a distortion that occurs in the bonding section due to a CTE difference between the semiconductor device and the substrate, in particular, under a high-temperature environment.

A power module according to a twenty-third aspect of the embodiment includes: a substrate; a power semiconductor device disposed on the substrate; a first layered bonding material disposed between the substrate and the power semiconductor device and bonding the substrate and the power semiconductor device; a heat radiating section disposed on an opposite side of the power semiconductor device on the substrate; and a second layered bonding material disposed between the substrate and the heat radiating section and bonding the substrate and the heat radiating section, wherein, in at least one of the first layered bonding material and the second layered bonding material, a coefficient of linear expansion of a base material is 5.5 to 15.5 ppm/K or less, and a first surface and a second surface of the base material are coated with lead-free solder.

When the present inventors actually performed verification with a cooling and heating cycle test, it was found that, according to such an aspect, it is possible to relax a distortion that occurs in a bonding section, in particular, under a high-temperature environment and achieve high reliability. According to the idea of the present inventors, the coefficient of linear expansion of the base material included in the layered bonding material is present in the middle between a coefficient of linear expansion of the semiconductor device and a coefficient of linear expansion of a material of the substrate and the heat radiating section and is balanced. Therefore, it is considered possible to relax a distortion that occurs in the bonding section due to a CTE difference between the semiconductor device and the substrate, in particular, under a high-temperature environment.

A power module according to a twenty-fourth aspect of the embodiment is the power module according to the twenty-second or twenty-third aspect, wherein the coefficient of linear expansion of the base material is 5.9 to 14.4 ppm/K.

When the present inventors actually performed verification with a cooling and heating cycle test, it was found that, according to such an aspect, it is possible to relax a distortion that occurs in a bonding section on the semiconductor device side, in particular, under a high-temperature environment and achieve high reliability.

A power module according to a twenty-fifth aspect of the embodiment is the power module according to any one of the twenty-second to twenty-fourth aspects, wherein the coefficient of linear expansion of the base material is 7.0 to 11.6 ppm/K.

When the present inventors actually performed verification with the cooling and heating cycle test, it was found that, according to such an aspect, an effect of relaxing a distortion that occurs in a bonding section on the substrate side is higher and it is possible to achieve higher reliability.

A power module according to a twenty-sixth aspect of the embodiment is the power module according to any one of the twenty-second to twenty-fifth aspects, wherein the base material is made of any one of a Cu—W-based material, a Cu—Mo-based material, a layered material of the Cu—W-based material and the Cu—Mo-based material, a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material.

According to such an aspect, since the base material has high thermal conductivity, it is possible to prevent an excessive temperature rise in the bonding section, a thermal distortion itself that occurs in the bonding section is reduced, and, as a result, this more advantageously acts on the extension of the life of a product.

A power module according to a twenty-seventh aspect of the embodiment is the power module according to any one of the twenty-second to twenty-sixth aspects, wherein a Cu content of the base material is 60% or lower.

According to such an aspect, since the coefficient of linear expansion of the base material included in the layered bonding material is lower, it is possible to further relax a distortion that occurs in the bonding section due to the CTE difference, in particular, under a high-temperature environment.

A power module according to a twenty-eighth aspect of the embodiment is the power module according to any one of the twenty-second to twenty-seventh aspects, wherein a Cu content of the base material is 15% or higher.

According to such an aspect, since the thermal conductivity of the base material included in the layered bonding material is further improved, a thermal distortion itself that occurs in the bonding section can be further reduced.

A power module according to a twenty-ninth aspect of the embodiment is the power module according to any one of the twenty-second to twenty-eighth aspects, wherein an interface between at least one of the first surface and the second surface of the base material and the lead-free solder is undercoated with Ni and Sn in order from the base material side.

According to such an aspect, it is possible to improve adhesion of the base material included in the layered bonding material and the lead-free solder.

A power module according to a thirtieth aspect of the embodiment is the power module according to any one of the twenty-second to twenty-ninth aspects, wherein at least one of a thickness of the lead-free solder with which the first surface is coated and a thickness of the lead-free solder with which the second surface is coated is 20 to 100 μm.

A power module according to a thirty-first aspect of the embodiment is the power module according to any one of the twenty-second to thirtieth aspects, wherein at least one of a ratio of thicknesses of the base material and the lead-free solder with which the first surface is coated and a ratio of thicknesses of the base material and the lead-free solder with which the second surface is coated is 2:1 to 10:1.

A power module according to a thirty-second aspect of the embodiment is the power module according to any one of the twenty-second to thirty-first aspects, wherein a melting point of the lead-free solder is 210° C. or higher. The melting point of the lead-free solder may be 230° C. or higher.

According to such an aspect, even when the temperature of the layered bonding material reaches high temperature equal to or higher than 200° C. because of a rise in an operating temperature of the power semiconductor device, the lead-free solder included in the layered bonding material can be prevented from melting to cause a breakdown.

A specific example of the embodiment is explained in detail below with reference to the accompanying drawings. Note that, in the following explanation and the drawings referred to in the following explanation, the same reference numerals and signs are used for portions that can be configured the same. Redundant explanation of the portions is omitted.

(Layered Bonding Material)

FIG. 1 is a longitudinal sectional view showing a schematic configuration of a layered bonding material 10 according to the embodiment.

As shown in FIG. 1, the layered bonding material 10 includes a base material 11 and pieces of lead-free solder 12a and 12b with which a first surface and a second surface of the base material 11 are coated.

Of the layered bonding material 10, the base material 11 is made of a material having a coefficient of linear expansion of 5.5 to 15.5 ppm/K. The base material 11 more preferably has a coefficient of linear expansion of 5.9 to 14.4 ppm/K and particularly preferably has a coefficient of linear expansion of 7.0 to 11.6 ppm/K. Specifically, for example, a Cu—W-based material or a Cu—Mo-based material is used as the base material 11. A layered material of the Cu—W-based material and the Cu—Mo-based material may be used as the base material 11. As the base material 11, any one of a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material may be used. When the base material 11 is made of the composite material, a ratio of thicknesses of the Cu—Mo-based material, the Cu—W-based material, or the layered material of the Cu—W-based material and the Cu—Mo-based material located in the center and the Cu-based material stacked on one surface thereof may be, for example, 4:1 to 1:2.

Note that, in this specification, the Cu—W-based material means a material having the largest contents of Cu and W in a mass ratio among elements constituting the material. A total of the contents of Cu and W is preferably 50% or higher in a mass ratio with respect to the entire material. The Cu—W-based material may include elements other than Cu and W as impurities. The Cu—Mo-based material means a material having the largest contents of Cu and Mo in a mass ratio among elements constituting the material. A total of the contents of Cu and Mo is preferably 50% or higher in a mass ratio with respect to the entire material. The Cu—Mo-based material may include elements other than Cu and Mo as impurities.

Since a coefficient of thermal expansion increases when the Cu content of the base material 11 increases, the Cu content of the base material 11 is preferably 60% or lower in a mass ratio.

Since thermal conductivity is improved when the Cu content of the base material 11 increases, the Cu content of the base material 11 is preferably 15% or higher in a mass ratio.

As shown in FIG. 1, a first surface (in an illustrated example, the upper surface) and a second surface (in the illustrated example, the lower surface) of the base material 11 are coated with the pieces of lead-free solder 12a and 12b, respectively.

The material of the pieces of lead-free solder 12a and 12b is not particularly limited. For example, an SnAgCu-based alloy or the like may be used. Note that the SnAgCu-based alloy means an alloy having the largest contents of Sn, Ag, and Cu in a mass ratio among elements constituting the alloy. A total of contents of Sn, Ag, and Cu is preferably 50% or higher in a mass ratio with respect to the entire alloy. The SnAgCu-based alloy may include elements other than Sn, Ag, and Cu as impurities. Specifically, for example, SAC305 (Sn3.0Ag0.5Cu) may be used as the pieces of lead-free solder 12a and 12b.

The lead-free solder 12a with which the first surface is coated and the lead-free solder 12b with which the second surface is coated may have the same composition or may have compositions different from each other.

A melting point of the pieces of lead-free solder 12a and 12b is preferably 210° C. or higher and may be 230° C. or higher, may be 240° C. or higher, or may be 250° C. or higher.

At least one of the thickness of the lead-free solder 12a with which the first surface is coated and the thickness of the lead-free solder 12b with which the second surface is coated is preferably 20 to 100 μm. Both of the thickness of the lead-free solder 12a with which the first surface is coated and the thickness of the lead-free solder 12b with which the second surface is coated may be 20 to 100 μm.

At least one of a ratio of the thicknesses of the base material 11 and the lead-free solder 12a with which the first surface is coated and a ratio of the thicknesses of the base material 11 and the lead-free solder 12b with which the second surface is coated is preferably 2:1 to 10:1. Both of the ratio of the thicknesses of the base material 11 and the lead-free solder 12a with which the first surface is coated and the ratio of the thicknesses of the base material 11 and the lead-free solder 12b with which the second surface is coated may be 2:1 to 10:1.

The coating of the pieces of lead-free solder 12a and 12b is performed by an existing method such as plating. The thicknesses of the coating may be adjusted by cladding.

As shown in FIG. 1, an interface between at least one of the first surface and the second surface of the base material 11 and the lead-free solder 12a or 12b is preferably undercoated (for example, plating) with Ni and Sn in order from the base material 11 side. Since an interface between the base material 11 and Sn is undercoated with Ni, diffusion of Sn to the base material 11 side can be suppressed. Since Sn is undercoated on Ni, it is easy to perform the coating of the pieces of lead-free solder 12a and 12b. Therefore, adhesion of the base material 11 and the pieces of lead-free solder 12a and 12b is improved. Interfaces between both of the first surface and the second surface of the base material 11 and the pieces of lead-free solder 12a and 12b may be undercoated (for example, plating) with Ni and Sn in order from the base material 11 side.

In the illustrated example, a first undercoat layer 13a by the undercoat treatment is formed between the first surface of the base material 11 and the lead-free solder 12a. A second undercoat layer 13b by the undercoat treatment is formed between the second surface of the base material 11 and the lead-free solder 12b.

(Semiconductor Package, Power Module)

Subsequently, a semiconductor package 20 according to the embodiment is explained with reference to FIG. 2. Note that, in this specification, when a semiconductor device 22 included in the semiconductor package 20 is a power semiconductor device, such a semiconductor package 20 (that is, the power semiconductor package) is sometimes referred to as power module.

Figure 2:
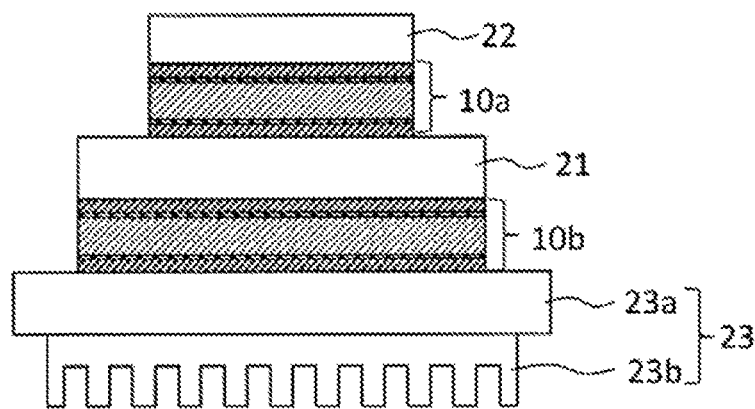
FIG. 2 is a longitudinal sectional view showing a schematic configuration of a semiconductor package according to the embodiment.

FIG. 2 is a longitudinal sectional view showing a schematic configuration of the semiconductor package 20 according to the embodiment.

As shown in FIG. 2, the semiconductor package 20 includes a substrate 21, a semiconductor device 22 disposed on the substrate 21, and a first layered bonding material 10a that bonds the substrate 21 and the semiconductor device 22.

The configuration of the first layered bonding material 10a is the same as the configuration of the layered bonding material 10 according to the embodiment explained above. Explanation of the configuration of the first layered bonding material 10a is omitted.

A type of the substrate 21 is not particularly limited. For example, a DBC (Direct Bonded Copper) substrate or a DBA (Direct Bonded Aluminum) substrate is used.

As shown in FIG. 2, the semiconductor device 22 is disposed on the substrate 21 via the first layered bonding material 10a. The substrate 21 and the semiconductor device 22 are bonded by the first layered bonding material 10a.

A type of the semiconductor device 22 is not particularly limited. For example, a power semiconductor device such as a power transistor or a power diode is used. In this case, even if the temperature of the first layered bonding material 10a reaches high temperature equal to or higher than 200° C. because of a rise in an operating temperature of the semiconductor device 22, if a melting point of the pieces of lead-free solder 12a and 12b is 210° C. or higher in the first layered bonding material 10a, the pieces of lead-free solder 12a and 12b can be prevented from melting to cause a breakdown.

In this embodiment, as shown in FIG. 2, the semiconductor package 20 further includes a heat radiating section 23 disposed on the substrate 21 and a second layered bonding material 10b that bonds the substrate 21 and the heat radiating section 23.

The configuration of the second layered bonding material 10b is the same as the configuration of the layered bonding material 10 according to the embodiment explained above. Explanation of the configuration of the second layered bonding material 10b is omitted.

As shown in FIG. 2, the heat radiating section 23 is disposed on the opposite side of the semiconductor device 22 on the substrate 21 via the second layered bonding material 10b. The substrate 21 and the heat radiating section 23 are bonded by the second layered bonding material 10b.

In an example shown in FIG. 2, the heat radiating section 23 includes a heat radiating plate 23a and a heat radiating fin 23b closely attached and fixed to one surface (in the illustrated example, the lower surface) of the heat radiating plate 23a. The other surface (in the illustrated example, the upper surface) of the heat radiating plate 23a is closely attached and fixed to the second layered bonding material 10b. As the material of the heat radiating section 23, a material having high thermal conductivity is used. For example, CuMo or CuW is used.

When the present inventors actually performed verification with a cooling and heating cycle test explained below, it was found that, according to this embodiment explained above, it is possible to relax a distortion that occurs in a bonding section, in particular, under a high-temperature environment and achieve high reliability. According to the idea of the present inventors, a coefficient of linear expansion of the base material 11 included in the first layered bonding material 10a and the second layered bonding material 10b is present in the middle between a coefficient of linear expansion of the semiconductor device 22 and a coefficient of linear expansion of the material of the substrate 21 and the heat radiating section 23 and is balanced. Therefore, it is considered possible to relax a distortion that occurs in a bonding section between the semiconductor device 22 and the substrate 21 and a bonding section between the substrate 21 and the heat radiating section 23 because of a CTE difference between the semiconductor device 22 and the substrate 21 and the heat radiating section 23, in particular, under a high-temperature environment.

According to this embodiment, the base material 11 included in the first layered bonding material 10a and the second layered bonding material 10b is made of any one of a Cu—W-based material, a Cu—Mo-based material, a layered material of the Cu—W-based material and the Cu—Mo-based material, a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material. Since the base material 11 has high thermal conductivity, it is possible to prevent an excessive temperature rise in the bonding section, a thermal distortion itself that occurs in the bonding section is reduced, and, as a result, this more advantageously acts on the extension of the life of a product of the semiconductor package 20.

According to this embodiment, a Cu content of the base material 11 included in the first layered bonding material 10a and the second layered bonding material 10b is 60% or lower. Therefore, the coefficient of linear expansion of the base material 11 is lower. It is possible to further relax a distortion that occurs in the bonding section due to the CTE difference, in particular, under a high-temperature environment.

According to this embodiment, a Cu content of the base material 11 included in the first layered bonding material 10a and the second layered bonding material 10b is 15% or higher. Therefore, the thermal conductivity of the base material 11 is improved and a thermal distortion itself that occurs in the bonding section can be further reduced.

According to this embodiment, in the first layered bonding material 10a and the second layered bonding material 10b, the interface between at least one of the first surface and the second surface of the base material 11 and the lead-free solder 12a or 12b is undercoated with Ni and Sn in order from the base material 11 side. Therefore, it is possible to improve adhesion of the base material 11 and the pieces of lead-free solder 12a and 12b.

According to this embodiment, in the first layered bonding material 10a and the second layered bonding material 10b, the melting point of the pieces of lead-free solder 12a and 12b is 210° C. or higher. Therefore, even when the temperature of the first layered bonding material 10a and the second layered bonding material 10b reaches high temperature equal to or higher than 200° C. because of a rise in an operating temperature of the semiconductor device 22, the pieces of lead-free solder 12a and 12b included in the first layered bonding material 10a and the second layered bonding material 10b can be prevented from melting to cause a breakdown.

EXAMPLES

Specific examples according to this embodiment are explained.

As shown in FIG. 3 and FIG. 4, the present inventors prepared bonding materials (6.5 mm square) of examples 1 to 20 and comparative examples 1 to 7 and created samples obtained by bonding a substrate (20 mm square; a Cu block having a thickness of 2 mm) and a semiconductor device (5.5 mm square; an Si chip having a thickness of 0.4 mm) using the bonding materials. Subsequently, the present inventors carried out a cooling and heating cycle test for the samples using a cold impact device TSA-71L-A (manufactured by Espec Corporation) under a test condition of −40° C. to +150° C. (exposure times of 0.5 h). The present inventors performed SAT observation for the samples at points in time before the cooling and heating cycle test, after 250 cycles, after 500 cycles, and after 1000 cycles from each of an Si chip side and a Cu base side using an ultrasonic video device FineSAT FAS200II (manufactured by Hitachi Kenki Fine Tech Co., Ltd.), calculated a defect part area ratio of a bonding section from an SAT observation image, and evaluated a change ratio of the defect part area ratio (a defect part change ratio). The defect part change ratio was calculated by the following Expression (1).

Defect part change ratio (%)={(defect part area ratio after 1000 cycles−defect part area ratio before the cooling and heating cycle test)/defect part area ratio after 1000 cycles}×100   Expression (1)

A row of the "defect part change ratio" in FIG. 3 and FIG. 4 indicates a test result. In FIG. 3 and FIG. 4, the defect part change ratio of "⊙" indicates that the defect part change ratio on the Si chip side is lower than 50% and the defect part change ratio on the Cu base side is lower than 99.5%. The defect part change ratio of "○" indicates that the defect part change ratio on the Si chip side is lower than 50% but the defect part change ratio on the Cu base side is 99.5% or higher. The defect part change ratio of "×" indicates that the defect part change ratio on the Si chip side is 50% or higher.

Figure 6:
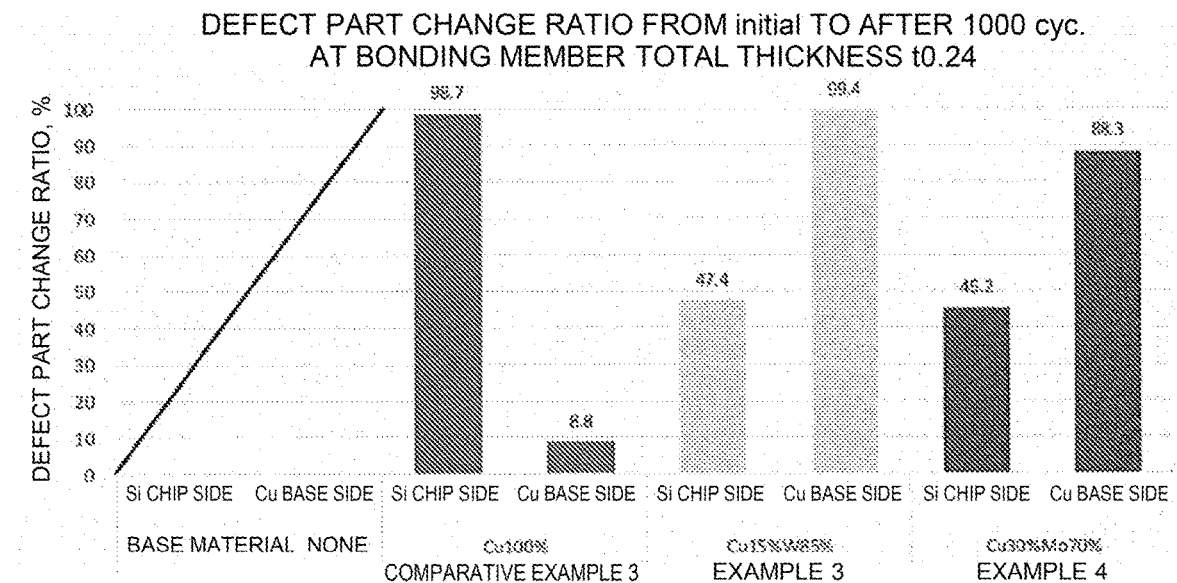
FIG. 6 is a bar graph showing defect part change ratios of examples 3 and 4 and a comparative example 3 in comparison.
Figure 7:
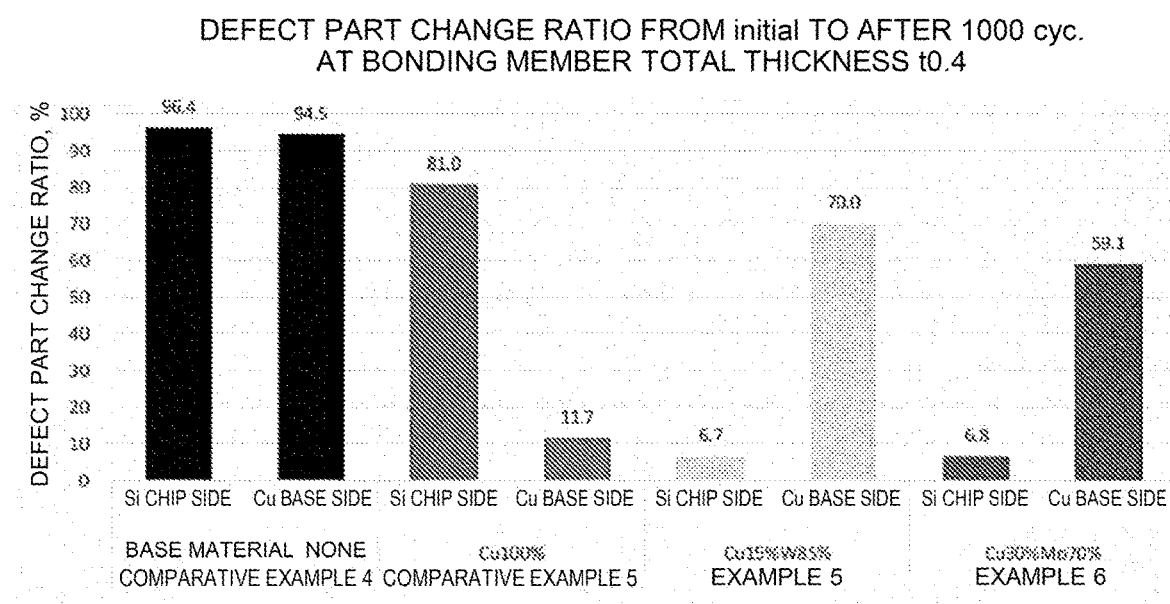
FIG. 7 is a bar graph showing defect part change ratios of examples 5 and 6 and comparative examples 4 and 5 in comparison.

FIG. 5 is a bar graph showing the defect part change ratios of the examples 1 and 2 and the comparative examples 1 and 2 in comparison. FIG. 6 is a bar graph showing the defect part change ratios of the examples 3 and 4 and the comparative example 3 in comparison. FIG. 7 is a bar graph showing the defect part change ratios of the examples 5 and 6 and the comparative examples 4 to 5 in comparison.

As shown in FIG. 3 to FIG. 7, in all of the examples 1 to 20, it was confirmed that the defect part change ratio on the Si chip side after 1000 cycles was lower than 50%, a distortion that occurred in a bonding section on the Si chip side, in particular, under a high-temperature environment was successfully relaxed, and reliability was high. On the other hand, as shown in FIG. 4, in the comparative examples 1 to 7, it was confirmed that the defect part change ratio on the Si chip side after 1000 cycles was 50% or higher (in the comparative examples 1 to 5, 80% or higher), a distortion that occurred in the bonding section on the Si chip side, in particular, under a high-temperature environment was not successfully relaxed, and reliability was low. In the examples 1 to 20, a coefficient of linear expansion of a base material is 5.9 to 14.4 ppm/K. On the other hand, in the comparative examples 1 and 4, the base material is absent, in the comparative examples 2, 3, and 5, the coefficient of linear expansion of the base material is as high as 17.1 ppm/K, and, in the comparative examples 6 and 7, the coefficient of linear expansion of the base material is as low as 4.6 to 5.2 ppm/K. Therefore, in a layered bonding material in which a first surface and a second surface of a base material are coated with lead-free solder, if a coefficient of linear expansion of the base material is 5.5 (the middle of 5.9 and 4.6) to 15.5 (the middle of 14.4 and 17.1) ppm/K, more preferably, 5.9 to 14.4 ppm/K, the defect part change ratio on the Si chip side after 1000 cycles is lower than 50%. It can be considered that it is possible to relax, in particular, a distortion that occurs in the bonding section on the Si chip side and achieve high reliability.

As shown in FIG. 3 and FIG. 4, in the examples 1 to 6, 9 to 10, and 12 to 18, it was confirmed that the defect part change ratio on the Cu base side was lower than 99.5% and a relaxing effect for a distortion that occurred in the bonding section on the Cu base side was higher. Whereas the coefficient of linear expansion of the base material is 7.0 to 11.6 ppm/K in the examples 1 to 6, 9 to 10, and 12 to 18, the coefficient of linear expansion of the base material is 5.9 to 6.8 ppm/K in the examples 7 to 8 and 11 and the coefficient of linear expansion of the base material is 13.8 to 14.4 ppm/K in the examples 19 and 20. Accordingly, in the layered bonding material in which the first surface and the second surface of the base material are coated with the lead-free solder, in order to have a higher relaxing effect for a distortion that occurs in the bonding section and achieve higher reliability, the coefficient of linear expansion of the base material is considered to be more preferably 7.0 to 11.6 ppm/K.

The embodiment and the modifications are explained above by illustration. However, the scope of the present technique is not limited to the embodiment and the modifications and can be changed and modified according to a purpose within the scope described in claims. The embodiment and the modifications can be combined as appropriate in a range in which processing contents do not contradict.

The invention claimed is:

1. A layered bonding material, comprising:
   a base material having a first surface and a second surface,
   a lead-free solder, and
   one of (i) a first undercoat layer disposed between the first surface of the base material and the lead-free solder, (ii) a second undercoat layer disposed between the second surface of the base material and the lead-free solder, or (iii) both a first undercoat layer disposed between the first surface of the base material and the lead-free solder and a second undercoat layer disposed between the second surface of the base material and the lead-free solder,
   wherein the undercoat layer is formed by undercoating with Ni and Sn in order from the base material side,
   wherein a coefficient of linear expansion of a base material is 5.5 to 15.5 ppm/K, and
   wherein the base material is made of any one of a Cu—W-based material, a Cu—Mo-based material, and a layered material of the Cu—W-based material and the Cu—Mo-based material.

2. The layered bonding material according to claim 1, wherein the coefficient of linear expansion of the base material is 5.9 to 14.4 ppm/K.

3. The layered bonding material according to claim 1, wherein the coefficient of linear expansion of the base material is 7.0 to 11.6 ppm/K.

4. The layered bonding material according to claim 1, wherein a Cu content of the base material is 60% or lower.

5. The layered bonding material according to claim 1, wherein a Cu content of the base material is 15% or higher.

6. The layered bonding material according to claim 1, wherein at least one of a thickness of the lead-free solder with which the first surface is coated and a thickness of the lead-free solder with which the second surface is coated is 20 to 100 μm.

7. The layered bonding material according to claim 1, wherein at least one of a ratio of thicknesses of the base material and the lead-free solder with which the first surface is coated and a ratio of thicknesses of the base material and the lead-free solder with which the second surface is coated is 2:1 to 10:1.

8. The layered bonding material according to claim 1, wherein a melting point of the lead-free solder is 210° C. or higher.

9. The layered bonding material according to claim 8, wherein the melting point of the lead-free solder is 230° C. or higher.

10. A semiconductor package comprising:
a substrate;
a semiconductor device disposed on the substrate; and
a layered bonding material disposed between the substrate and the semiconductor device and bonding the substrate and the semiconductor device,
wherein the layer bonding material comprises:
  a base material having a first surface and a second surface,
  a lead-free solder, and
  one of (i) a first undercoat layer disposed between the first surface of the base material and the lead-free solder, (ii) a second undercoat layer disposed between the second surface of the base material and the lead-free solder, or (iii) both a first undercoat layer disposed between the first surface of the base material and the lead-free solder and a second undercoat layer disposed between the second surface of the base material and the lead-free solder,
  wherein the undercoat layer is formed by undercoating with Ni and Sn in order from the base material side,
  wherein, a coefficient of linear expansion of the base material is 5.5 to 15.5 ppm/K, and
  wherein the base material is made of any one of a Cu—W-based material, a Cu—Mo-based material, and a layered material of the Cu—W-based material and the Cu—Mo-based material.

11. The semiconductor package according to claim 10, wherein the coefficient of linear expansion of the base material is 5.9 to 14.4 ppm/K.

12. The semiconductor package according to claim 10, wherein the coefficient of linear expansion of the base material is 7.0 to 11.6 ppm/K.

13. The semiconductor package according to claim 10, wherein a Cu content of the base material is 60% or lower.

14. The semiconductor package according to claim 10, wherein a Cu content of the base material is 15% or higher.

15. The semiconductor package according to claim 10, wherein at least one of a thickness of the lead-free solder with which the first surface is coated and a thickness of the lead-free solder with which the second surface is coated is 20 to 100 μm.

16. The semiconductor package according to claim 10, wherein at least one of a ratio of thicknesses of the base material and the lead-free solder with which the first surface is coated and a ratio of thicknesses of the base material and the lead-free solder with which the second surface is coated is 2:1 to 10:1.

17. The semiconductor package according to claim 10, wherein a melting point of the lead-free solder is 210° C. or higher.

18. The semiconductor package according to claim 17, wherein the melting point of the lead-free solder is 230° C. or higher.

19. A semiconductor package comprising:
a substrate;
a semiconductor device disposed on the substrate;
a first layered bonding material disposed between the substrate and the semiconductor device and bonding the substrate and the semiconductor device;
a heat radiating section disposed on an opposite side of the semiconductor device on the substrate; and
a second layered bonding material disposed between the substrate and the heat radiating section and bonding the substrate and the heat radiating section,
wherein at least one of the first layered bonding material and the second layered bonding material comprises
  a base material having a first surface and a second surface,
  a lead-free solder, and
  one of (i) a first undercoat layer disposed between the first surface of the base material and the lead-free solder, (ii) a second undercoat layer disposed between the second surface of the base material and the lead-free solder, or (iii) both a first undercoat layer disposed between the first surface of the base material and the lead-free solder and a second undercoat layer disposed between the second surface of the base material and the lead-free solder,
  wherein the undercoat layer is formed by undercoating with Ni and Sn in order from the base material side,
  wherein a coefficient of linear expansion of the base material is 5.5 to 15.5 ppm/K, and wherein the base material is made of any one of a Cu—W-based material, a Cu—Mo-based material, and a layered material of the Cu—W-based material and the Cu—Mo-based material.

20. A power module comprising:
a substrate; a power semiconductor device disposed on the substrate; and
a layered bonding material disposed between the substrate and the power semiconductor device and bonding the substrate and the power semiconductor device,
wherein the layered bonding material comprises
  a base material having a first surface and a second surface,
  a lead-free solder, and
  one of (i) a first undercoat layer disposed between the first surface of the base material and the lead-free solder, (ii) a second undercoat layer disposed between the second surface of the base material and the lead-free solder, or (iii) both a first undercoat layer disposed between the first surface of the base material and the lead-free solder and a second undercoat layer disposed between the second surface of the base material and the lead-free solder,
  wherein the undercoat layer is formed by undercoating with Ni and Sn in order from the base material side,
  wherein a coefficient of linear expansion of the base material is 5.5 to 15.5 ppm/K, and
  wherein the base material is made of any one of a Cu—W-based material, a Cu—Mo-based material, and a layered material of the Cu—W-based material and the Cu—Mo-based material.

21. The power module according to claim 20, wherein the coefficient of linear expansion of the base material is 5.9 to 14.4 ppm/K.

22. The power module according to claim 20, wherein the coefficient of linear expansion of the base material is 7.0 to 11.6 ppm/K.

23. The power module according to claim 20, wherein a Cu content of the base material is 60% or lower.

24. The power module according to claim 20, wherein a Cu content of the base material is 15% or higher.

25. The power module according to claim 20, wherein at least one of a thickness of the lead-free solder with which the first surface is coated and a thickness of the lead-free solder with which the second surface is coated is 20 to 100 μm.

26. The power module according to claim 20, wherein at least one of a ratio of thicknesses of the base material and the lead-free solder with which the first surface is coated and a ratio of thicknesses of the base material and the lead-free solder with which the second surface is coated is 2:1 to 10:1.

27. The power module according to claim 20, wherein a melting point of the lead-free solder is 210° C. or higher.

28. The power module according to claim 27, wherein the melting point of the lead-free solder is 230° C. or higher.

29. A power module comprising:
   a substrate;
   a power semiconductor device disposed on the substrate;
   a first layered bonding material disposed between the substrate and the power semiconductor device and bonding the substrate and the power semiconductor device;
   a heat radiating section disposed on an opposite side of the power semiconductor device on the substrate; and
   a second layered bonding material disposed between the substrate and the heat radiating section and bonding the substrate and the heat radiating section,
   wherein at least one of the first layered bonding material and the second layered bonding material comprises
      a base material having a first surface and a second surface,
      a lead-free solder, and
      one of (i) a first undercoat layer disposed between the first surface of the base material and the lead-free solder, (ii) a second undercoat layer disposed between the second surface of the base material and the lead-free solder, or (iii) both a first undercoat layer disposed between the first surface of the base material and the lead-free solder and a second undercoat layer disposed between the second surface of the base material and the lead-free solder,
   wherein the undercoat layer is formed by undercoating with Ni and Sn in order from the base material side,
   wherein a coefficient of linear expansion of the base material is 5.5 to 15.5 ppm/K, and
   wherein the base material is made of any one of a Cu—W-based material, a Cu—Mo-based material, and a layered material of the Cu—W-based material and the Cu—Mo-based material.

\* \* \* \* \*